United States Patent
Kirschner et al.

(10) Patent No.: US 6,476,386 B1
(45) Date of Patent: Nov. 5, 2002

(54) METHOD AND DEVICE FOR TUNNEL MICROSCOPY

(75) Inventors: Jürgen Kirschner; Wulf Wulfhekel, both of Halle (DE)

(73) Assignee: Max-Planck- Gesselschaft zur Forderung der Wissenschaften e.V. (DE)

( * ) Notice: Subject to any disclaimer, the term of this patent is extended or adjusted under 35 U.S.C. 154(b) by 0 days.

(21) Appl. No.: 09/532,555

(22) Filed: Mar. 22, 2000

(30) Foreign Application Priority Data

Mar. 22, 1999 (DE) .......................... 199 12 814

(51) Int. Cl.[7] ............................................. G01N 23/00
(52) U.S. Cl. ........................................................ 250/302
(58) Field of Search ................................ 250/306, 307; 324/200; 365/118

(56) References Cited

U.S. PATENT DOCUMENTS

| | | | | |
|---|---|---|---|---|
| 4,907,195 A | * | 3/1990 | Kazan et al. | 365/118 |
| 4,939,363 A | | 7/1990 | Bando et al. | |
| 4,985,627 A | | 1/1991 | Gutierrez et al. | |
| 5,266,897 A | | 11/1993 | Watanuki et al. | |
| 5,289,455 A | * | 2/1994 | Kuroda et al. | 250/306 |
| 5,375,087 A | | 12/1994 | Moreland et al. | |
| 5,436,448 A | | 7/1995 | Hosaka et al. | |
| 5,465,046 A | | 11/1995 | Campbell et al. | |
| 5,513,518 A | | 5/1996 | Lindsay | |
| 5,515,719 A | | 5/1996 | Lindsay | |
| 5,612,491 A | | 3/1997 | Lindsay | |
| 5,753,814 A | | 5/1998 | Han et al. | |
| 5,824,470 A | * | 10/1998 | Baldeschwieler et al. | 435/6 |
| 5,925,818 A | * | 7/1999 | Cleveland et al. | 73/105 |

FOREIGN PATENT DOCUMENTS

EP    0 866 341 A2    2/1998

OTHER PUBLICATIONS

1998 The American Physical Society, Physical Review Letters, "Spin–Polarized Vacuum Tunneling into the Exchange–Split Surface State of Gd(0001)", by M. Bode, et al., vol. 81, No. 19, Nov. 9, 1998, p. 4256.

1997 American Institute of Physics, Appl. Phys. Lett. 71(21), "Magnetic domains of cobalt ultrathin films observed with a scanning tunneling microscope using optically pumped GaAs tips", by Y. Suzuki, Nov. 24, 1997, p. 3153.

Journal of Magnetism and Magnetic Materials, "Optical effects in spin–polarized scanning tunneling microscopy with GaAs probes", by R. Jansen, et al. 198–199 (1999) 668–670.

(List continued on next page.)

Primary Examiner—Jack Berman
Assistant Examiner—Johnnie L Smith
(74) Attorney, Agent, or Firm—Schnader Harrison Segal & Lewis LLP (57) ABSTRACT

In a method for scanning microscopy, for which the surface of a sample is scanned point-by-point using a tunnel tip and locally resolved tunnel current measurement is performed, during scanning the tunnel tip is remagnetized by a predetermined remagnetization frequency, and from the tunnel current ($I_t$) or a z coordinate of the distance between the tunnel tip and the sample or a value derived from this, locally resolved signal components are derived, occurring at the remagnetization frequency and being characteristic for magnetic sample properties, whereby on the basis of the derived signal components an imaging of the magnetic structure of the sample surface is performed.

18 Claims, 5 Drawing Sheets

OTHER PUBLICATIONS

IBM Technical Disclosure Bulliten, "Structure of a Magnetic Tip for Scanning Probe Microscope Recording", vol. 37 No. 12 Dec. 1994 p. 439.

American Institute of Physics 1992; Appl. Phys. Lett. 60 (7), "Magnetic field imaging by using magnetic force scanning tunneling microscopy", by R. D. Gomez, et al., Feb. 17, 1992, p. 906.

Physical Review Letters, "Surface Studies by Scanning Tunneling Microscopy" by G. Binning, et al., vol. 49, No. 1, Jul. 5, 1982, p. 57.

1990 American Institute of Physics; J. Appl. Phys. 67(3), "10–nm resolution by magnetic force microscopy on FeNdB", by P. Grütter, et al. Feb. 1, 1990, p. 1437.

1997 American Institute of Physics; Appl. Phys. Lett. 70(10), "Observation of magnetic domains using a reflection–mode scanning near–field optical microscope", by C. Durkan, et al., Mar. 10, 1997 p. 1323.

"Twenty–nm Resolution Spin–polarized Scanning Electron Microscope", by Hideo Matsuyama, et al., J. Electron Microsc vol. 43, No. 3 1994, p. 157–163.

"Tunneling Between Ferromagnetic Films", by M. Julliere Physics Letters vol. 54A, No. 3, Sep. 8. 1975, p. 225.

2000 The American Physical Society, Physical Review Letters, "Real–Space Observation of Dipolar Antiferromagnetism in Magnetic Nanowires by Spin–Polarized Scanning Tunneling Spectroscopy", by O. Pietzsch, et al., vol. 84, No. 22, May 29, 2000, p. 5212.

1999 The American Physical Society, Physical Review Letters, "Temperature–Dependent Exchange Splitting of a Surface State on a Local–Moment Magnet: Tb(0001)", by M. Bode, et al., vol. 83, No. 15, Oct. 11, 1999, p. 3017.

* cited by examiner

METHOD AND DEVICE FOR TUNNEL MICROSCOPY

TECHNICAL FIELD OF THE INVENTION

The invention concerns a method for tunnel microscopy, especially a tunnel microscopy method for recording the magnetic, spin or susceptibility structure of a sample, and a tunnel micro scope (a so-called "spin-polarized tunnel microscope") for implementation of the method as well as methods for use of such a tunnel microscope.

PRIOR ART

Figure 6:
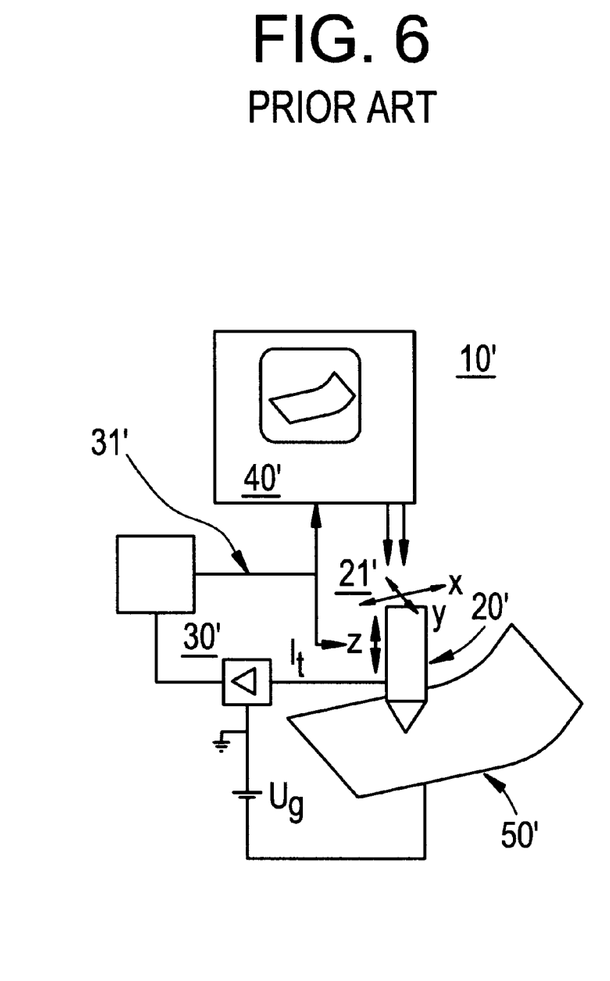

A traditional tunnel microscope, for instance as described by G. Binnig et al. in "Phys. Rev. Lett.", Vol. 49, 1992, p. 57 ff., is shown in the diagram in FIG. 6. The tunnel microscope 10' is designed for non-contact scanning of a sample 50' on the basis of the tunnel effect. The tunnel microscope 10' specifically includes a tunnel tip 20' with a piezo-electrical drive 21', a control circuit 30' and a display and evaluation system 40'. The tunnel tip 20' typically consisting of tungsten is moved across the surface of the sample 50' using the piezo-electrical drive 21' for scanning in the x and y directions. During scanning, the tunnel current between the tunnel tip 20' and the surface is continuously measured and using the control loop 31' of the control circuit 30', the z coordinate of the tunnel tip is set so that the tunnel current remains constant during scanning. The two-dimensional dependency of the z coordinate from the x and y coordinates represents the topography of the sample surface, which may be displayed using the display and evaluation system 40' and be subject to further image processing. Using a tunnel tip 20' sharpened in atomic dimensions, for this mapping of the topography, local resolutions below the nm range may be achieved.

Further investigation methods are known which use scanning microscopes, for which for local resolution not the tunnel current, but for instance optical characteristics or electrical field effects are measured at the sample surface. There is specifically also interest in recording the spin structure of a sample, i.e. the magnetic sample characteristics using a local resolution typical to tunnel microscope examination methods. In this respect, in particular, the following three magnetic scanning microscopy techniques are known.

The tunnel microscope known from U.S. Pat. No. 5,266,897 is based on magnetic force microscopy (MFM). The tunnel microscope is operated using a vibrating cantilever tip, which is subject to effects of magnetic forces with reference to the sample surface. The magnetic force between the sample and the cantilever tip is effected depending on the magnetic sample characteristics, so that the distance of the tip to the sample and, therefore, the tunnel current through the cantilever tip changes. This technology has the following disadvantages.

For magnetic force microscopy, the magnetic recording of the structure is based on the local resolution of measurement of force exerted on a magnetic tip by the magnetic stray field of a sample. But the stray field of the sample is not a local surface characteristic. To the contrary, it is created in the sample volume. The local resolution is limited by the so-called "magnetic volume" of the tip. The best local resolution for the MFM method is in the range of 20 to 40 nm. The MFM method is furthermore disadvantageous because contrast formation is effected by magnetization of a layer reaching into the sample volume, and therefore possibly the image of the sample surface is adulterated. Also, MFM is usually operated as non-contacting. Due to the long-range magnetic interaction, the local resolution even for a working distance between tip and sample of some nanometers is limited. Only in case the of provision of specific precautions, for instance as described by P. Grutter et al. in "J. Appl. Phys.", Vol. 67, 1990, p. 1437 ff., the may local resolution be improved to up to 10 nm.

In the case of magnetooptic near field microscopy (SNOM), the sample surface is also scanned using a detector tip. The detector tip essentially includes a sharp glass fiber which locally resolved measures the magnetooptic Kerr effect at a resolution of below the wavelength of the light used. The local resolution of the magnetooptic SNOM method is defined laterally by focussing of the light field and vertically by the penetration depth into the sample. Up to now, only a local resolution of up to 60 nm has been achieved (refer to C. Durkan et al. in "Appl. Phys. Lett.", Vol. 70, 1997, p. 1323 ff.).

Scanning electronic microscopy with polarization analysis (SEM-PA) is based on recording of the spin polarization of secondary electrons shot out of the top atomic layers of a sample using a scanning electronic microscope. The disadvantage of this method is again the limited local resolution, which is laterally limited by the focus of the primary electron beam and achieves about up to 20 nm (refer to H. Matsuyama et al. in "J. of Electron Microscopy", Vol. 43, 1994, p. 157 ff.).

Figure 7:
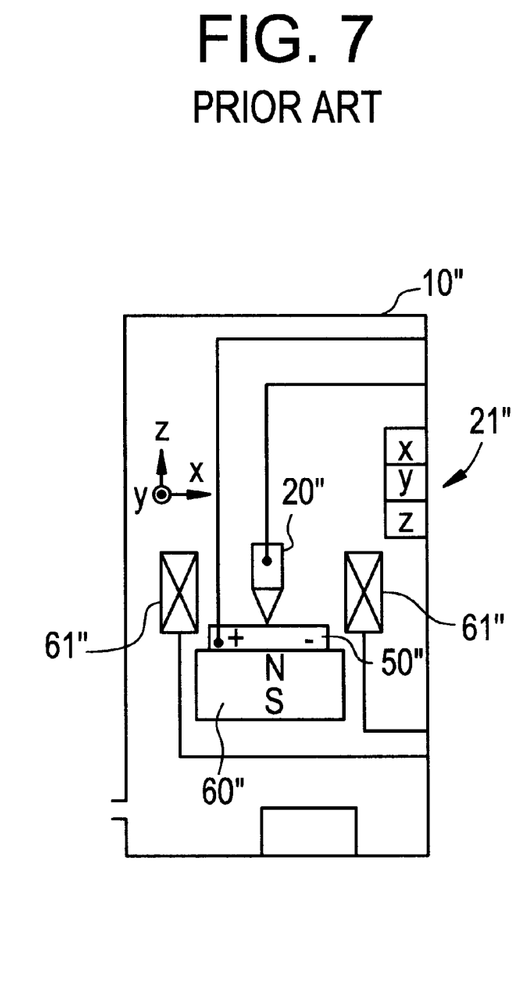

From U.S. Pat. No. 4,939,363 (corresponding to EP 0 348 239 A1), a tunnel microscope for investigation of the magnetic characteristics of a sample surface is known, which is partially shown in schematic FIG. 7. The tunnel microscope 10" specifically comprises the tunnel tip 20" with piezo-electrical drive 21" as well as (not shown) the control circuit and the display and evaluation system. Below the sample 50", a permanent magnet 60" is arranged, which cooperates with magnetic coils 61" with reversable polarity as follows. Using the permanent magnet 60" and the magnetic coils 61", the tunnel tip 20" is magnetized in such a manner that a magnetic field forms in axial the direction from the tunnel tip to the sample. On the basis of the so-called "magnetic tunnel effect" (refer to M. Julliere in "Phys. Lett. A", Vol. 54, 1975, p. 225 ff.), the tunnel current depends on the orientation of the spins of the electrons in the sample relative to the spins of the tip. The magneto tunnel effect is based on the dependency of tunnel probability from the energetically split state densities of the electrons in the sample. Locally resolved spin measurement is achieved by performing two tunnel current measurements. Within each case different tip magnetization is performed at each measuring point of the tunnel tip 20". The spin state at the sample location may be derived from the tunnel current difference for the two orientations of the magnetic field. Even though, using this technology, in comparison with the above stated technologies, theoretically a substantially better local resolution of up to a few Ångström may be achieved, the spin-polarized tunnel microscope according to U.S. 4,939,363 is disadvantageous for the following reasons.

For a conventional tunnel microscope, in contrary to the spin-independent microscopy (according to FIG. 6, see above), the z position of the tunnel tip is not controlled so that the tunnel current is constant ("constant current mode"). Instead, the tunnel current is in each case measured for the different magnetizations for constant z coordinate. Measurement with variable tunnel current is disadvantageous due to the deviation of the measuring principle from the traditional spin-independent microscopes. Also, signal evaluation with great effort must be performed to separately derive the topographical properties and the magnetic properties from the measured current values. This evaluation is performed subsequently using numerical means so that additional time is required for recording the surface image. An important disadvantage furthermore consists in the fact that for the magnetic tunnel effect the dependency of the tunnel current on the magnetization direction is substantially lower than the dependency of the tunnel current from the distance tip-sample. Because the dependency of magnetization only amounts to about 20% of the dependency on topography, when recording a tunnel image of the surface of a ferromagnet using a magnetic tip, the magnetic domains indeed become visible in the tunnel image. But it is almost completely blanketed by the topographic contrasts. Finally, the function of the conventional spin-polarized tunnel microscope is limited by the fact that the tunnel tip 20″ (see FIG. 7) consists of EuS-coated tungsten or nickel, which due to its relatively high coercive force requires strong fields also having an effect on the sample. In addition, due to change in magnetization due to the large magnetostriction, geometrical changes of the tip occur, which have an interfering effect on the tunnel current. When using a EuS coated tip, the tip must be cooled down to cryogenic temperatures, which forms a substantial further disadvantage.

The object of the invention is to provide a new and improved scanning microscope method by which magnetic properties, especially the spin structure, of a sample surface may be recorded, with high local resolution in the range of atomic dimensions, with improved precision and increased speed of image recording. The object of the invention also consists in providing a scanning microscope by which such a method may be implemented.

SUMMARY OF THE INVENTION

According to a first aspect of the invention, a method for tunnel microscopy is provided for which the surface of a sample is scanned for each individual position using a tunnel tip and locally resolved tunnel current measurement is performed, whereby, during scanning periodic remagnetization of the tunnel tip is performed using a predetermined remagnetization frequency (f) and locally resolved signal components are derived from the tunnel current ($I_t$) or a z coordinate of the distance between the tunnel tip and the sample or a value derived from it, which occur at the remagnetization frequency (f) and are characteristic for magnetic sample properties, and imaging of the magnetic structure of the sample surface is performed on the basis of the derived signal components, whereby the tunnel tip is not subject to geometrical change during scanning and the signal components measured with local resolution are characteristic for the magneto-tunnel resistance between the sample and tunnel tip and the imaged magnetic structure of the sample surface includes the local spin polarization properties of the sample surface.

According to a further aspect of the invention, a scanning microscope is provided, which comprises a tunnel tip, which may be moved across the surface of a sample in an evacuated sample chamber using a piezo-electric drive, a control circuit for control of the tunnel tip, a display and evaluation system for display and processing of surface properties of the probe, a magnetization device for remagnetization of the tunnel tip at a predetermined remagnetization frequency (f) and a phase-sensitive amplifier, designed for phase-sensitive amplification of the tunnel current ($I_t$) or the z coordinate of the tunnel tip or of values derived from them at the remagnetization frequency (f) or a multiple of it, whereby the magnetization device at least includes a coil and an oscillator, which is adapted for applying electrical currents to the coil, which change direction at the magnetization frequency (f), and the tunnel tip at least partially consists of a material having such a low saturation magnetostriction that for remagnetization essentially no geometrical changes of the tunnel tip occur.

The invention is specifically based on the idea to provide a scanning microscope with a magnetizable tunnel tip and to record the magnetotunnel resistance between the tunnel tip and the sample surface by means of a differential detection method, by means of periodic remagnetization of the tunnel tip during scanning of the sample surface using a specific remagnetization frequency (f) and deriving signal components from the tunnel current, a tip-sample distance coordinate (z coordinate) or a value derived from this, which occur at the remagnetization frequency (f) and which are characteristic for the sample properties. Preferably, phase-sensitive analysis is performed to record tunnel current changes at the frequency of periodic remagnetization (magnetic reversal). This change in tunnel current corresponds to the magnetic contrast of the sample surface which is independent of the topographical contrast and which is recorded simultaneously with it. Using the method according to the invention, in deviation from traditional MFM methods, not the magnetic stray field of a sample, but the local spin polarization on the basis of the magnetotunnel effect is measured.

The method according to the invention is preferably implemented in "constant current mode". This means that as for the traditional tunnel microscope according to FIG. 6, provision is made during scanning of the sample surface in the x and y directions that the z coordinate of the tunnel tip is set so that the tunnel current is constant in time average. The frequency of remagnetization according to a preferred embodiment is greater than the cut-off frequency of the control circuit for setting the z coordinate. According to a modified embodiment, a remagnetization frequency is also possible which is smaller than the cut-off frequency of z tracking. In the first case, remagnetization is performed so fast that the drive system is not able to react to remagnetization and, therefore, the tunnel current is modulated with the desired variation according to the magnetic structure of the sample at the remagnetization frequency. In the second case (low remagnetization frequency), the tunnel tip could be moved in case of changes of the tunnel current dependent on the spin polarization. In the case of phase-sensitive analysis of the z coordinate of the tunnel tip, a signal characteristic for the spin structure of the sample surface is in turn detectable.

A scanning microscope according to the invention is specifically characterized by a tunnel tip being able to be remagnetized and a magnetizing device for the tunnel tip. The tunnel tip consists of a material which depend in g on the application is more soft magnetic than the material of the sample. The material of the tunnel tip is selected in such a manner that the tunnel tip does not show a hysteresis effect when remagnetized and remains geometrically-mechanically unchanged. For this purpose, the material of the tunnel tip preferably has a low coercive force (for instance below 1 oerstedt respectively 3 mA/cm) and a low saturation magnetostriction (for instance below $2*10^{-7}$).

An important characteristic of the invention concerns the properties of the tunnel tip. The tunnel tip is a stiff component which is operated free of vibrations. It has the shape of a stiff tip or a stiff pin with a sharp end. In deviation from the cantilever tip of traditional tunnel microscopes, the tunnel tip of the tunnel microscope according to the invention is not deformed during operation, specifically during remagnetization. The stiff mount of the tunnel tip in the tunnel microscope enables the highly sensitive tunnel current measurement for recording of spin polarization. The tunnel tip is not changed by the stray field of the sample.

The invention has th e following advantages. Using the combination of spin-dependent detection of electrons on the basis of differential magnetotunnel resistance using scanning microscopy, atomic local resolutions below 10 nm up to a few Angstrom are achieved. The high local resolution results from the fact that an intrinsic value of the surface (spin polarization) is recorded. The great local resolutions are better by magnitudes than the corresponding parameters of the MFM, SNOM or SEMPA methods. Therefore, for the first time, examinations of the spin structure of condensed matter with atomic resolution (for instance anti-ferromagnets, ferromagnets and/or magnetic composite materials) or of micro-magnetic structures (domains and domain walls) are possible with practically acceptable measuring periods (1/ms per point) and precision. For contrast formation, only the top atomic layers of the sample surface are important. This is advantageous in basic research, for instance for examination of surface processes, and also for applications in data storage technology.

BRIEF DESCRIPTION OF THE DRAWINGS

Shown are.

PREFERRED EMBODIMENTS OF THE INVENTION

Figure 1:
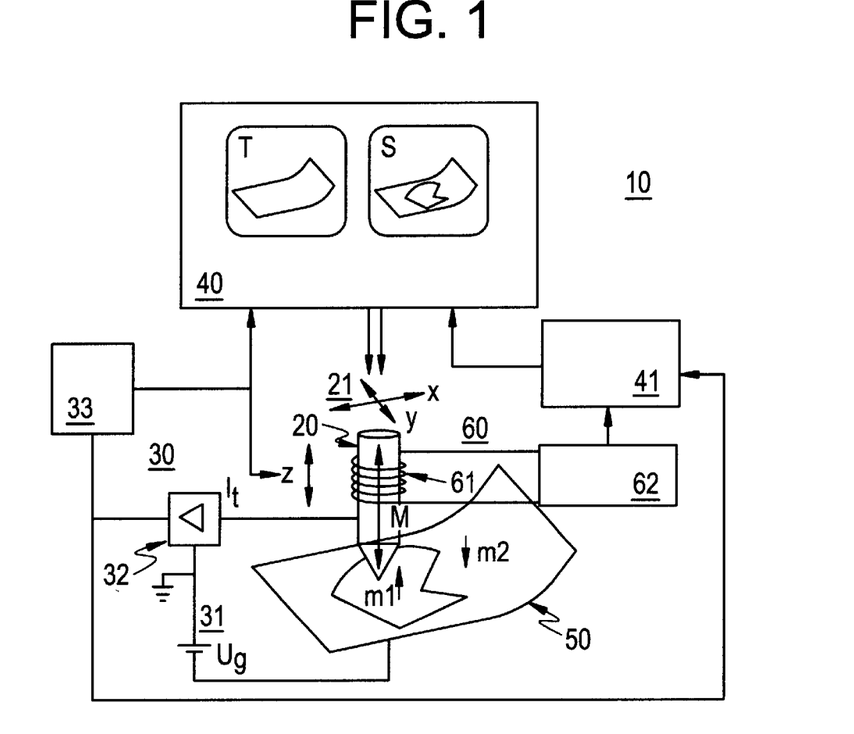
FIG. 1 a schematic overview representation of a scanning microscope according to the invention, FIG. 2 the construction of an embodiment of a magnetic tunnel tip for a scanning microscope according to the invention, FIG. 3–5 examples for surface images achieved using the method according to the invention, FIG. 6 a schematic overview representation of a conventional scanning microscope (prior art), and FIG. 7 an illustration of a conventional magnet scanning microscope (prior art).

According to FIG. 1, a scanning microscope 10 according to the invention comprises a tunnel tip 20, which is adapted for raster scanning of the surface of the sample 50 in an evacuated sample chamber (not shown) at a distance from this, a control circuit 30, a display and evaluation system 40 and a magnetization device 60. The invention is not limited to applications with a scanning microscope operated in an evacuated sample chamber, but is able to be implemented for scanning microscopy in an electrolyte or in an inert gas. The tunnel tip 20 may be moved in the x, y and z directions using a piezoelectrical drive 21. The details of the piezoelectrical drive 21, the control circuit 30 with the bias voltage circuit 31, the current/voltage converter 32 and the z controller 33 and the display and evaluation system 40, to the extent as the display of topographic surface characteristics are concerned, are known from conventional scanning microscopes and are, therefore, not described in detail here. The bias voltage circuit 31 is provided for applying a voltage $U_g$ between the tunnel tip 20 and the sample 50 for triggering a tunnel current $I_t$. The voltage $U_g$ for instance amounts to between −2V and +2V (±0.01V). The tunnel current $I_t$ is converted into a characteristic voltage using the current-voltage converter (after amplification), which is used as an input signal for the z controller 33. The z controller 33 has a characteristic so that the piezoelectric drive 21 is moved in the z direction in such a manner that the tunnel current $I_t$ is constant in time average. The respective z coordinate of the piezoelectric drive 21 is simultaneously signaled to the display and evaluation system in which the topography image T is displayed.

The tunnel tip 20 is fastened to the drive 21. It is a stiff component. The distance of the free tip end of the tunnel tip 20 from the sample surface is exclusively dependent on the setting for the drive 21. Geometrical deformation of the tunnel tip 20 during microscope operation is excluded.

The tunnel tip 20 with the above stated low parameters coercive force and saturation magnetostriction at least at the free tip end for instance consists of amorphous iron, amorphous cobalt, iron-silicon or permalloy (manufacturer: for instance Vakuumschmelze Hanau). Alternatively, all other magnetic materials may be used, which have a coercive force and a saturation magnetostriction like amorphous iron or cobalt. The tunnel tip 20 does not necessarily fully consist of this material, but preferably only at the tunnel tip end facing the sample 50, as this is explained below under reference to FIG. 2. The dimension of the tunnel tip essentially conforms to the geometric properties of traditional tunnel tips of spin-independent scanning microscopes.

The magnetization device 60 comprises a coil 61 and an oscillator 62. The coil 61 is designed depending on the design and material of the tunnel tip and may for instance be a wound wire coil with an inside diameter below 2 mm, which is fastened to the tunnel tip 20 and moved across the sample surface with it, or a fixed coil arrangement, which surrounds the outer edge of the sample 50 and is set up for remagnetization of the tunnel tip 20. The magnetic field of a fixed coil at a distance to the tunnel tip may also be transmitted to the tunnel tip using a magnetic yoke. Alternatively, the coil 61 may also be provided as coil-shaped coating on the tunnel tip 20, whereby for electric insulation between the coil and the tunnel tip an insulation layer is applied as well. The coil 61 consists of a good conducting metal wire or strip, for instance made of a noble metal or copper.

The oscillator 62 contains a power source whose polarity may be reversed at a predetermined frequency according to the application-dependent desired remagnetization frequency f. Accordingly, the current directions changing with the remagnetization frequency f flow through the coil 61, so that the direction of magnetization M (direction of the arrow) changes at the remagnetization frequency between the positive and negative z direction. The magnetic field has an intensity of about 1–2 oerstedt.

Connected to the display and evaluation system 40 is a phase-sensitive amplifier 41 (lock-in amplifier 41), which supplies the image signals for display and processing of the surface image S with magnetic contrast. The lock-in amplifier 41 as input an value receives the output voltages of the current-voltage converter 32, which are characteristic for the current tunnel current $I_t$. The connection of the current-voltage converter 32 to the lock-in amplifier 41 is specifically provided for (as shown) if the magnetization device 60 is operated at a remagnetization frequency f which is higher than the cut-off frequency of z tracing of the piezoelectric drive 21. Alternatively, in case the of remagnetization frequencies below this cut-off frequency it is possible to provide for routing the output signal of the z controller 33 as an input signal for the lock-in amplifier 41.

The input signal of the lock-in amplifier 41 according to the magnetic tunnel effect bears a modulation at the remagnetization frequency f, whose amplitude depends on the magnetic contrast of the sample surface image. This modulation is amplified phase-sensitively by the lock-in amplifier and input to the display and evaluation system 40 as an image signal. In the case of remagnetization frequencies in the range >10 kHz, integration values of up to below 1 ms/point may be achieved.

The construction of a scanning microscope according to the invention according to FIG. 1 is as follows. Due to the effect of the magnetized ferromagnetic tunnel tip 20, the tunnel current $I_t$ (typically ~1 nA) due to the magnetic tunnel effect, i.e. due to separation of the state densities in the tunnel tip 20, respectively, in the surface of the sample 50 into minority and majority state densities, depends on relative orientation of magnetization between the tunnel tip 20 and the sample 50 (arrow directions $m_1$, $m_2$)

In the case of magnetization aligned in parallel, the tunnel current $I_t$ reaches a maximum in the case of constant tip-sample distance and a minimum in case of antiparallel setting. The magnetic contrast in the tunnel image created by the image signals on the basis of the z coordinates or t he tunnel current values is separated from topographical contrast by means of differential measurement of the tunnel current between parallel and antiparallel alignment. During scanning of the sample surface, the tunnel tip 20 is periodically remagnetized in the alternating field of the coil 61 without effecting magnetization of the sample 50 by the field of the coil 61. If the remagnetization frequency f is higher than the cut-off frequency of z tracking, then the variations of the tunnel current occur at the frequency f, which may be traced back to the magnetic tunnel effect and which is amplified phase-sensitively using the lock-in amplifier 41. The remagnetization frequency f is preferrably higher than 10 kHz for this design, for instance in the range 20–80 kHz.

Figure 2:
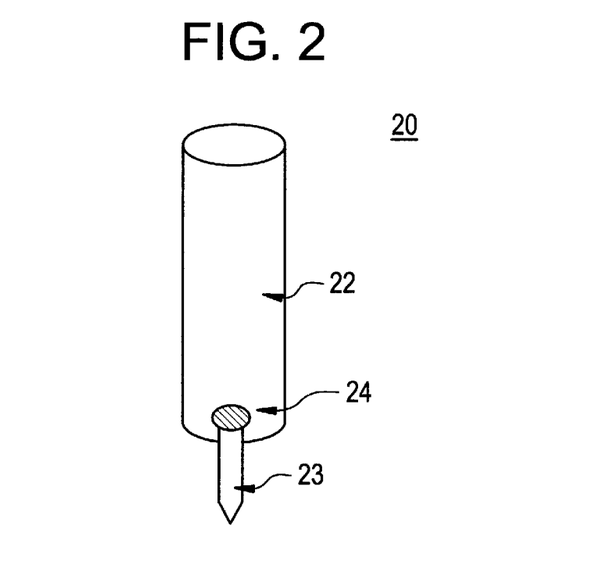

FIG. 2 shows an example for a tunnel tip 20 used according to the invention in enlarged, schematic representation. The tunnel tip 20 consists of a tip shaft 22 and a magnetic tip 23 connected with an electrically conductive connection 24. The tip shaft 22 consists of an anti-magnetic wire, like for instance tungsten. The thickness of the tip shaft 22 essentially corresponds to the dimensions of traditional tunnel tips and for instance amounts to about 200 μm. The magnetic tip 23 consists of an amorphous film made of the above stated easily remagnetizable materials. The magnetic tip 23 has been cut out of the amorphous film and has a thickness of about 25 μm and a lateral length of about 500 μm. The magnetic tip 23 may alternatively also be produced by etching a wire made of the amorphous material.

The magnetic tip 23 is glued to the tip shaft 22 using the connecting means 24, for instance using fluid silver. The tunnel tip 20 composed in such a manner is activated in the ultra high vacuum of the scanning microscope before the measurement, i.e. cleaned. Activation is performed by bombarding the tunnel tip 20 with ions (in-situ cleaning by argon sputtering), especially of the magnetic tip 23, and/or by mechanical contact to with a ferromagnet.

Alternatively, the tunnel tip 2 may also be integrally made of one material. For this purpose, for instance, a wire made of a suitable magnetic material with a starting diameter of 100 μm is etched to the desired tip diameter.

Figure 3:
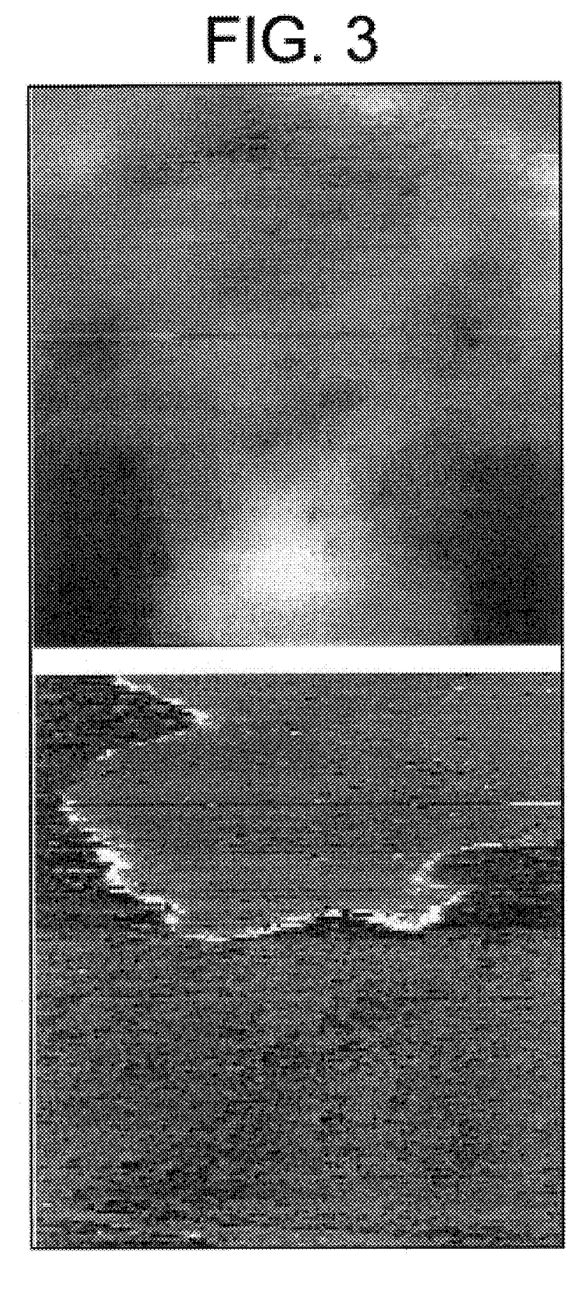
Figure 4:
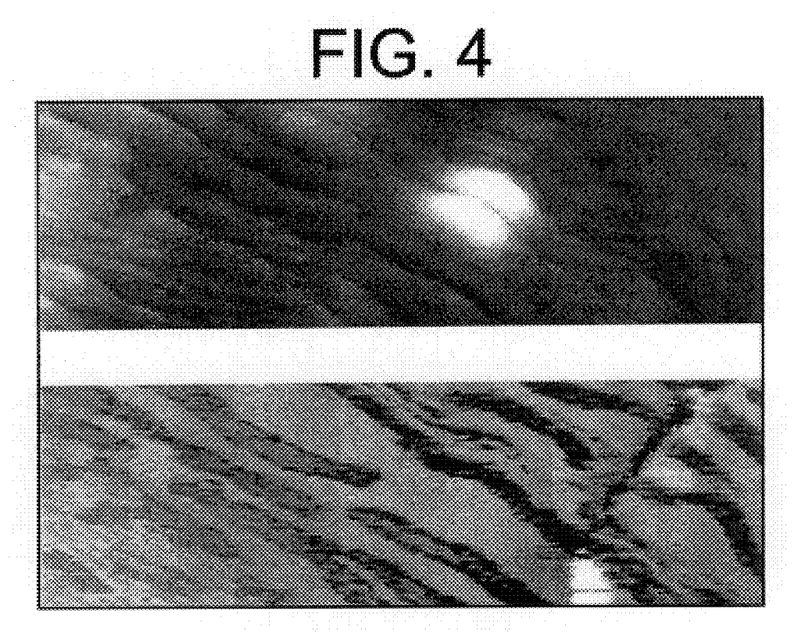

FIGS. 3 and 4 show tunnel microscope recordings recorded according to the invention of the surfaces of polycrystalline nickel and monocrystalline cobalt, respectively (0001 surface). The section of the image in each case amounts to 2.5*2.5 μm (nickel) and 8*2.5 μm (cobalt), respectively. In the upper part of the image, the topographical contrast and in the lower part of the image the magnetic contrast of the same sample location is displayed. These tunnel microscopic images show the excellent quality of the spin structure representations which are gained simultaneously in realtime with the topographical representations with high image contrast.

Figure 5:
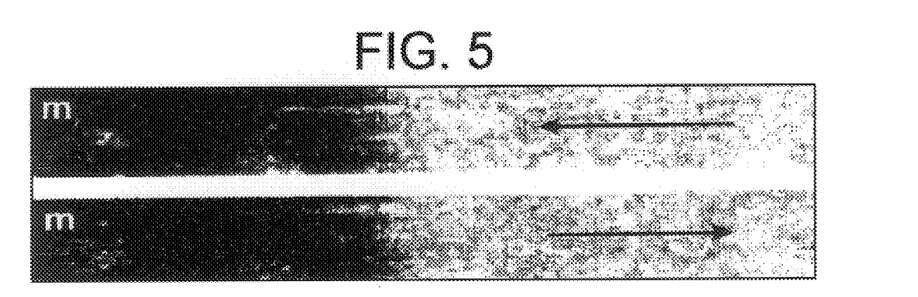

FIG. 5 shows a section of a surface scanned by a tunnel microscope at a transition between different spin polarization states with different scanning directions. An excellent local resolution of about 1 nm results. As an additional advantage, the scanning result is independent from the scanning direction.

The scanning microscope according to the invention may be modified as follows. Differential measurement of the tunnel current is based on the asymmetry of the spin-dependent state densities in the case of projection on the direction of magnetization of the tip. For the design shown above, magnetization of the tunnel tip is vertical to the sample surface, i.e. the normal component of the spin-dependent state density is measured. The microscope may be modified in such a manner that also components of the spin-dependent state density are measured which are in the plane of the sample surface. For this purpose, preferably the magnetizing device is modified, for instance by turning the coil, so that the external magnetic field is not aligned along the tunnel tip, but aslant to it. Alternatively to the coil composition of coil 61 shown, it is also possible to provide for a more complex composition made of several partial coils, which during scanning in the aforementioned manner is controlled depending on the desired components of the spin state density. For swiveling the outer magnetization relative to the sample surface, it is also possible to change the tunnel tip, for instance by applying a magnetic tip on the tip shaft according to FIG. 2 during tip composition, which is aslant to the longitudinal axis of the tip shaft at a predetermined angle. This angle may for instance amount to up to 45°.

For highly resolved measurements of the domain structure of sample surfaces according to the invention, additional measures may be provided for during operation of a tunnel microscope according to the invention as follows. It is possible to provide for cleaning of the sample surface and the tunnel tip by ion sputtering under UHV conditions. Furthermore, application-dependent, it may be advantageous to bake out the sample before measurement (for instance for 20 min. at about 600° K).

Besides magnetization of a sample surface, alternatively in case of soft magnetic materials the local susceptibility may be measured using the scanning microscope according to the invention.

Using the magnetic field of the tunnel tip, magnetization of a soft magnetic sample is effected using the exciting frequency (remagnetization frequency) f. Measurement of local magnetotunnel resistance results in variations at the median frequency 2f. This doubling of the median frequency of tunnel current variations results from the fact that magnetization of the sample follows remagnetization of the tunnel tip with a delay, so that during each half magnetization period of the tunnel tip two opposed magnetizations of the sample surface are recorded.

The lock-in technology described may be replaced by recording of measured values, for which by electronic means signal components of the respective measuring value are recorded which occur at the remagnetization frequency. Calibration with respect to the measuring values, for instance at maximum field strength, enables deriving of magnetic properties.

The embodiments described above are set for non-touching scanning operation. However, the tunnel tip may at least at the end pointing at the sample be provided with an insulating layer (for instance oxide layer), so that during the scanning operation, mechanical contact between the tunnel tip and the sample is enabled. This method has the advantage of faster scanning movement in the x and y directions, respectively, and, therefore, in x respectively y direction and therefore faster image recording.

Preferential application of the invention is in investigation of the magnetic properties of the surfaces of solids and in data storage technology. In data storage technology, writing of extremely narrowly stored information in a soft magnetic material as well as reading of this information using the excellent local resolution described above is possible. Writing of information to be stored magnetically is performed by variation of the outer magnetic field at the tunnel tip according to the information to be written, whereby the material being locally below the tunnel tip is remagnetized.

This material has a coercive force being lower than the outer magnetic field of the tunnel tip. Reading of information is accordingly performed reciprocally according to the scanning method described above.

Further applications result with the implementation of new measuring methods for determination of atomic spin orientation in basic research.

What is claimed is:

1. A method for scanning microscopy comprising:

scanning point-by-point the surface of a sample using a tunnel tip not subject to substantial geometric changes;

periodically remagnetizing the tunnel tip at a predetermined remagnetization frequency (f) during scanning;

performing locally resolved measurement of current ($I_t$) generated at the tunnel tip;

deriving locally resolved signal components from the tunnel current ($I_t$) or a z coordinate of the distance between the tunnel tip and the sample or a value derived thereof, which occur at the remagnetization frequency (f) and which are characteristic for magnetic sample properties, wherein the signal components measured at local resolution are characteristic for the magnetotunnel resistance between the sample and the tunnel tip and the imaged magnetic structure of the sample surface includes local spin polarization properties of the sample surface; and imaging the magnetic structure of the sample surface on the basis of signal components derived.

2. The method according to claim 1, wherein the tunnel current ($I_t$), the z coordinate or the derived value are amplified phase-sensitively at the remagnetization frequency (f) and imaging is performed on the basis of the signal amplified phase-sensitively.

3. The method according to claim 1, wherein the remagnetization frequency (f) is larger than the cut-off frequency of tracking of the tunnel tip in the z direction and wherein the tunnel current ($I_t$) or a value derived therefrom is subject to phase-sensitive amplification during scanning.

4. The method according to claim 1, wherein the remagnetization frequency (f) is higher than about 10 kHz.

5. The method according to claim 1, wherein the remagnetization frequency (f) is lower than the cut-off frequency of tracking of the tunnel tip in the z direction and the z coordinate is subject to phase-sensitive amplification during scanning.

6. The method according to claim 1, wherein remagnetization is performed using a coil being moved with the tunnel tip across the surface of the sample during scanning.

7. The method according to claim 1, wherein remagnetization is performed using a coil with a fixed position with respect to the sample.

8. The method according to claim 1, wherein components of the spin state density of the sample surface are determined, which are aligned vertically ($m_1$, $m_2$) to the plane of the sample surface and/or in the plane of the sample surface.

9. The method according to claim 1, wherein the material of the sample is softer than the material of the tunnel tip and measuring of susceptibility of the sample is performed by phase-sensitive amplification at a frequency corresponding to double the remagnetization frequency.

10. The method according to claim 1, wherein a display and evaluation system imaging of topographical surface characteristics (T) of the sample and an imaging of magnetic surface characteristics (S) of the sample are simultaneously used.

11. A scanning microscope comprising:

a tunnel tip which is adapted to be moved across the surface of a sample in an evacuated sample chamber using a piezoelectric drive and at least partially consists of stiff material which at remagnetization is not subject to substantial geometrical changes;

a control circuit operatively connected to the tunnel tip to control movement of the tunnel tip;

a display and evaluation system operatively connected to the tunnel tip for display and processing surface characteristics of the sample based on movement of the tunnel tip;

a magnetizing device for periodic remagnetization of the tunnel tip at a predetermined remagnetization frequency (f) including at least one coil and one oscillator adapted for subjecting the coil with electrical currents changing direction at the magnetization frequency; and a phase-sensitive amplifier provided for phase-sensitive amplification of the tunnel current ($I_t$) or the z coordinate of the tunnel tip or values derived therefrom at the remagnetization frequency (f) or multiples thereof.

12. The scanning microscope according to claim 11, wherein the tunnel tip at least partially consists of a material having a coercive force which is lower than the coercive force of the sample material.

13. The scanning microscope according to claim 11, wherein the tunnel tip at least partially consists of a material with a material with a coercive force below about 1 Oerstedt and a saturation magnetostriction below about $2 \times 10^{-7}$.

14. The scanning microscope according to claim 11, wherein the coil is fixed to the tunnel tip and movable with it.

15. The scanning microscope according to claim 11, wherein the coil is located in a fixed position with respect to the sample.

16. A tunnel tip designed for use in a scanning microscope according to claim 11 and which at least partially consists of a material selected from the group consisting of amorphous iron, iron-silicon, permalloy, amorphous cobalt, materials having a coercive force and saturation magnetostriction like amorphous iron.

17. The tunnel tip according to claim 16 including a tip shaft, a tip end capable of being remagnetized and a connecting means by which the magnetic tip is mounted to the tip shaft.

18. A method of utilizing a scanning microscope according to claim 11, comprising:

writing and/or reading information in magnetic materials, or investigating surfaces of solid bodies and thin layers.

* * * * *

UNITED STATES PATENT AND TRADEMARK OFFICE
CERTIFICATE OF CORRECTION

PATENT NO. : 6,476,386 B1
DATED : November 5, 2002
INVENTOR(S) : Kirschner et al.

It is certified that error appears in the above-identified patent and that said Letters Patent is hereby corrected as shown below:

<u>Column 2,</u>
Line 40, please insert -- the -- before "axial".

<u>Column 4,</u>
Line 45, please delete "case of".

<u>Column 9,</u>
Lines 3 and 4, please delete "in x respectively y direction and therefore".

Signed and Sealed this

Fifth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,476,386 B1
DATED : November 5, 2002
INVENTOR(S) : Kirschner et al.

It is certified that error appears in the above-identified patent and that said Letters Patent is hereby corrected as shown below:

<u>Title page,</u>
Item [73], Assignee, please change "Max-Planck-Gesselschaft" to
-- Max-Planck-Gesellschaft --.

Signed and Sealed this

Eleventh Day of November, 2003

JAMES E. ROGAN
*Director of the United States Patent and Trademark Office*